(12) United States Patent
Xie et al.

(10) Patent No.: US 10,079,173 B2
(45) Date of Patent: Sep. 18, 2018

(54) METHODS OF FORMING METALLIZATION LINES ON INTEGRATED CIRCUIT PRODUCTS AND THE RESULTING PRODUCTS

(71) Applicant: GLOBALFOUNDRIES Inc., Grand Cayman (KY)

(72) Inventors: Ruilong Xie, Niskayuna, NY (US); Lars Liebmann, Mechanicville, NY (US); Daniel Chanemougame, Troy, NY (US); Geng Han, Fishkill, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/285,092

(22) Filed: Oct. 4, 2016

(65) Prior Publication Data
US 2018/0096932 A1    Apr. 5, 2018

(51) Int. Cl.
| H01L 29/768 | (2006.01) |
|---|---|
| H01L 23/528 | (2006.01) |
| H01L 21/768 | (2006.01) |
| H01L 21/02 | (2006.01) |

(Continued)

(52) U.S. Cl.
CPC .... *H01L 21/76816* (2013.01); *H01L 21/0217* (2013.01); *H01L 21/02164* (2013.01); *H01L 21/76802* (2013.01); *H01L 21/76814* (2013.01); *H01L 21/76832* (2013.01); *H01L 21/76835* (2013.01); *H01L 21/76861* (2013.01); *H01L 21/76877* (2013.01); *H01L 21/76879* (2013.01);

(Continued)

(58) Field of Classification Search
CPC ......... H01L 21/02304; H01L 21/76224; H01L 21/76829; H01L 21/76831; H01L 21/76837; H01L 21/76802; H01L 21/76814; H01L 21/76816; H01L 21/76835; H01L 21/76832; H01L 21/76877–21/76879; H01L 23/5226; H01L 23/5283; H01L 29/0653; H01L 29/0649; H01L 2221/1057; H01L 21/76843

See application file for complete search history.

(56) References Cited

U.S. PATENT DOCUMENTS

| 9,054,164 B1 | 6/2015 | Jezewski et al. |
| 2008/0237868 A1* | 10/2008 | Clevenger ......... H01L 21/76808 257/758 |
| 2016/0181425 A1* | 6/2016 | Bai ..................... H01L 29/7848 438/283 |

* cited by examiner

Primary Examiner — Julio J Maldonado
Assistant Examiner — Abbigale Boyle
(74) Attorney, Agent, or Firm — Amerson Law Firm, PLLC

(57) ABSTRACT

One illustrative method disclosed includes, among other things, forming a layer of insulating material comprising a first insulating material above a substrate and forming a metallization blocking structure in the layer of insulating material at a location that is in a path of a metallization trench to be formed in the layer of insulating material, the metallization blocking structure comprising a second insulating material that is different from the first insulating material. The method also includes forming the metallization trench in the layer of insulating material on opposite sides of the metallization blocking structure and forming a conductive metallization line in the metallization trench on opposite sides of the metallization blocking structure.

22 Claims, 9 Drawing Sheets

(51) Int. Cl.
*H01L 29/40* (2006.01)
*H01L 23/522* (2006.01)
(52) U.S. Cl.
CPC ...... *H01L 23/5226* (2013.01); *H01L 23/5283* (2013.01); *H01L 29/401* (2013.01)

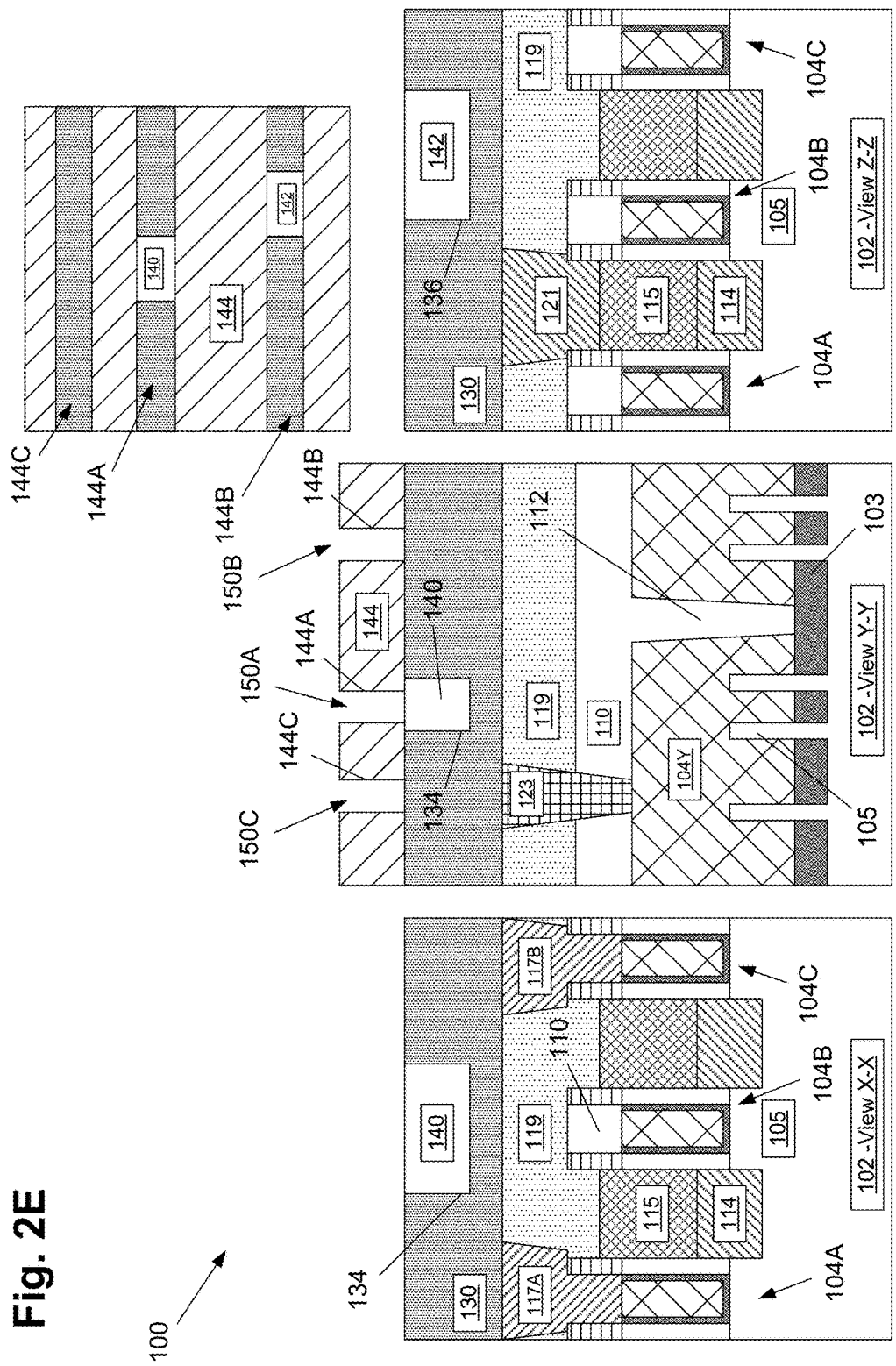

METHODS OF FORMING METALLIZATION LINES ON INTEGRATED CIRCUIT PRODUCTS AND THE RESULTING PRODUCTS

BACKGROUND OF THE INVENTION

1. Field of the Invention

The present disclosure generally relates to the fabrication of integrated circuits, and, more particularly, to various methods of forming metallization lines on integrated circuit products and the resulting products.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar transistor devices, FinFET transistor devices, nanowire transistor devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region. In addition to transistors, which is an example of an active circuit element or semiconductor device, an integrated circuit product also includes passive circuit elements such as, for example, resistors, capacitors, etc.

In order for these circuit elements to function as part of an overall electrical circuit, electrical connections must be made to the circuit elements. In the case of a transistor, that typically involves establishing an electrical connection to the gate structure and to each of the source/drain regions. Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in a metallization system that comprises one or more additional stacked so-called "metallization layers" that are formed above the device level of the product. These metallization layers are typically comprised of layers of insulating material with conductive metal lines or conductive vias formed in the layers of insulating material. Generally, the conductive lines provide the intra-level electrical connections, while the conductive vias provide the inter-level connections or vertical connections between different levels of the conductive lines. These conductive lines and conductive vias may be comprised of a variety of different materials, e.g., copper, tungsten, aluminum, etc. (with appropriate barrier layers). The first metallization layer in an integrated circuit product is typically referred to as the "M1" layer. Normally, a plurality of conductive vias (typically referred to as "V0" vias) are used to establish electrical connection between the M1 layer and lower level conductive structures—so called device-level contacts (explained more fully below). In some more advanced devices, another metallization layer comprised of conductive lines (sometimes called the "M0" layer) is formed between the device level contacts and the V0 vias.

FIG. 1A is a cross-sectional view of an illustrative integrated circuit product 10 comprised of a plurality of transistor devices 11 formed in and above a semiconductor substrate 12. FIG. 1B is a simplistic plan view of a single transistor device 11. These drawings depict a plurality of so-called "CA contact" structures 14 for establishing electrical connection to the simplistically depicted source/drain regions 20 of the device 11, and a gate contact structure 16 which is sometimes referred to as a "CB contact" structure. As shown in FIG. 1B, the CB gate contact 16 is typically positioned vertically above the isolation material 13 that surrounds the device 11, i.e., the CB gate contact 16 is typically not positioned above the active region defined in the substrate 12, but it may be in some advanced architectures.

With reference to FIGS. 1A-1B, the transistors 11 comprise an illustrative gate structure 22, i.e., a gate insulation layer 22A and a gate electrode 22B, a gate cap 24, a sidewall spacer 26 and simplistically depicted source/drain regions 20. As noted above, the isolation region 13 has also been formed in the substrate 12 at this point in the process flow. At the point of fabrication depicted in FIG. 1A, layers of insulating material 30A, 30B, i.e., interlayer dielectric materials, have been formed above the substrate 12. Other layers of material, such as contact etch stop layers and the like, are not depicted in the attached drawings. Also depicted are illustrative raised epi source/drain regions 32 and source/drain contact structures 34 which include a combination of a so-called "trench silicide" (TS) structure 36. The CA contact structures 14 may be in the form of discrete contact elements, i.e., one or more individual contact plugs having a generally square-like shape (as shown in FIG. 1B) or cylindrical shape when viewed from above, that are formed in an interlayer dielectric material. In other applications (not shown in FIG. 1B), the CA contact structures 14 may also be a line-type feature that contacts underlying line-type features, e.g., the TS structure 36 that contacts the source/drain region 20, and typically extends across the entire active region on the source/drain region 20 in a direction that is parallel to that of the gate structure 22. The TS structures 36, CA contacts 14 and the CB contact 16 are all considered to be device-level contacts within the industry.

FIG. 1A depicts an illustrative example of a product 10 that includes a so-called M0 metallization layer of the multi-level metallization system for the product 10. The M0 metallization layer is formed in a layer of insulating material 46, e.g., a low-k insulating material, and it is formed to establish electrical connection to the device-level contacts—CA contacts 14 and the CB contact 16. Also depicted in FIG. 1A is the so-called M1 metallization layer for the product 10 that is formed in a layer of insulating material 38, e.g., a low-k insulating material. A plurality of conductive vias—so-called V0 vias 40—are provided to establish electrical connection between the M0 metallization layer and the M1 metallization layer. Both the M0 metallization layer and the M1 metallization layer typically include a plurality of metal lines 44, 42 (respectively) that are routed as needed across the product 10. The formation of the M0 metallization layer may be helpful in reducing the overall resistance of the circuits formed on the substrate 12.

The metallization lines, e.g., the lines 44, 42, are typically formed by forming long continuous trenches in their associated layer of insulating material across substantially the entire substrate. Thereafter, these trenches are filled with one or more conductive materials and one or more chemical mechanical polishing (CMP) processes are performed to remove excessive conductive materials outside of the trench.

The net result is, at this point in the typical process flow, the metallization lines are relatively long continuous structures that extend across the entire substrate. Ultimately, portions of the continuous metallization lines must be removed or "cut" to establish a functional wiring pattern for the integrated circuits, i.e., a single continuous metallization line may be cut into several smaller segments that are electrically isolated from one another so that each of these individual, small "post-cut" segments may be individually contacted by other components of the metallization system. However, cutting these continuous metallization lines into smaller segments can be a very challenging and time consuming process that may adversely impact product yields.

The present disclosure is directed to various methods of forming metallization lines on integrated circuit products and the resulting products that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming metallization lines on integrated circuit products and the resulting products. One illustrative method disclosed includes, among other things, forming a layer of insulating material comprising a first insulating material above a semiconductor substrate and forming a metallization blocking structure in the layer of insulating material at a location that is in a path of a metallization trench to be formed in the layer of insulating material, the metallization blocking structure comprising a second insulating material that is different from the first insulating material. In this example, the method also includes, after forming the metallization blocking structure, forming the metallization trench in the layer of insulating material on opposite sides of the metallization blocking structure and forming a conductive metallization line in the metallization trench on opposite sides of the metallization blocking structure.

One example of an illustrative IC product with a metallization layer disclosed herein includes, among other things, a first layer of insulating material comprising a first insulating material positioned above a semiconductor substrate and a metallization blocking structure positioned in an opening in the first layer of insulating material, the metallization blocking structure comprising a second insulating material that is different from the first insulating material. In this example, the product also includes a metallization trench defined in the first layer of insulating material on opposite sides of the metallization blocking structure and a conductive metallization line positioned in the metallization trench on opposite sides of the metallization blocking structure.

BRIEF DESCRIPTION OF THE DRAWINGS

The disclosure may be understood by reference to the following description taken in conjunction with the accompanying drawings, in which like reference numerals identify like elements, and in which:

FIGS. 2A-2G depict various novel methods disclosed herein for forming metallization lines on integrated circuit products and the resulting products.

Figure 1A:
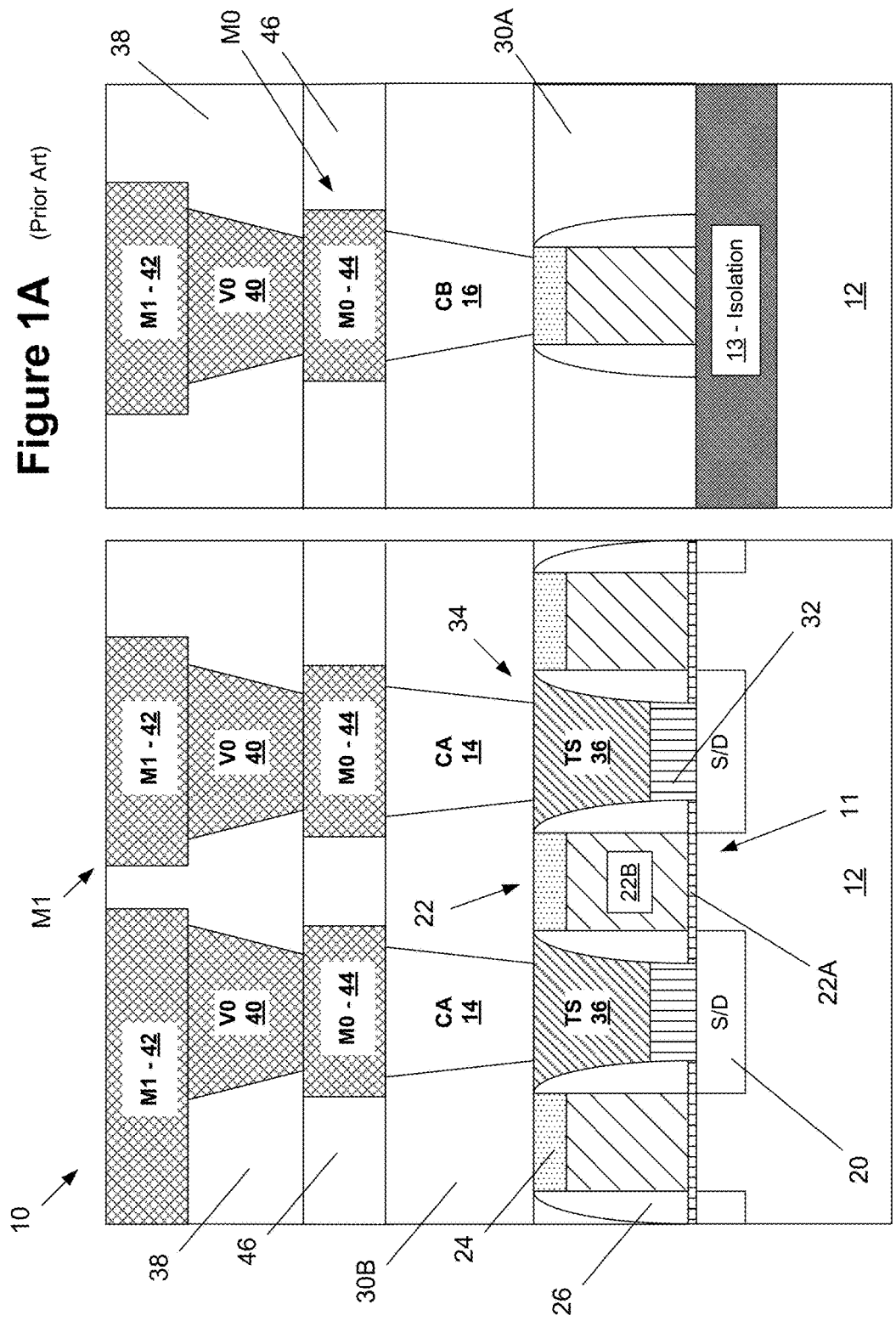
FIGS. 1A-1B depict various illustrative prior art arrangements of device-level contacts and metallization layers for an integrated circuit product.
Figure 1B:
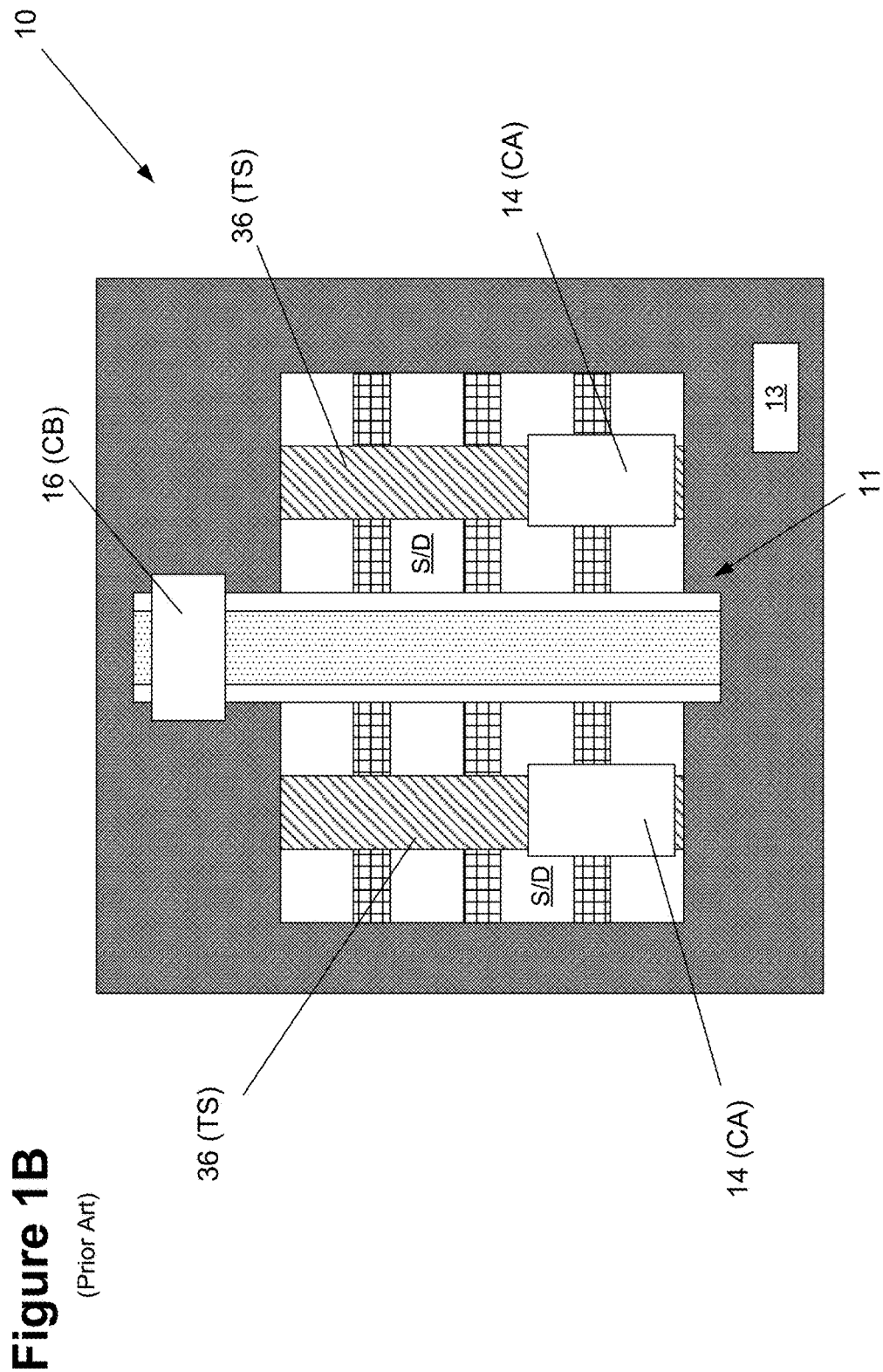

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various novel methods disclosed herein for forming conductive metallization lines on integrated circuit products and the resulting products. The methods and devices disclosed herein may be employed in manufacturing products using a variety of technologies, e.g., NMOS, PMOS, CMOS, etc., and they may be employed in manufacturing a variety of different integrated circuit products, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. Thus, the presently disclosed inventions should not be considered to be limited to any particular form of transistors. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2A-2G depict various novel methods disclosed herein for forming conductive metallization lines of a metallization system for an integrated circuit (IC) product 100. The product 100 is formed in and above a semiconductor substrate 102. In the depicted example, the IC product 100 comprises three illustrative FinFET devices with three illustrative gates 104A-C and a plurality of fins 105. Of course, after a complete reading of the present application, those skilled in the art will appreciate that the method disclosed herein may be employed on an IC product 100 comprised of any type of semiconductor device, e.g., planar transistor devices, gate-all-around devices, vertical transistor devices, capacitors, resistors, etc. Additionally, the present disclosure will depict the formation of conductive metallization lines in the so-called M0 metallization layer by way of example only. As will be appreciated by those skilled in the art after a complete reading of the present application, the methods disclosed herein may be employed when forming conductive metallization lines at any level of the metallization system of the IC product 100. Moreover, the conductive metallization lines may be formed so as to establish electrical contact to an underlying conductive contact structure, such as a conductive via or line previously formed in an underlying layer of insulating material.

Figure 2A:
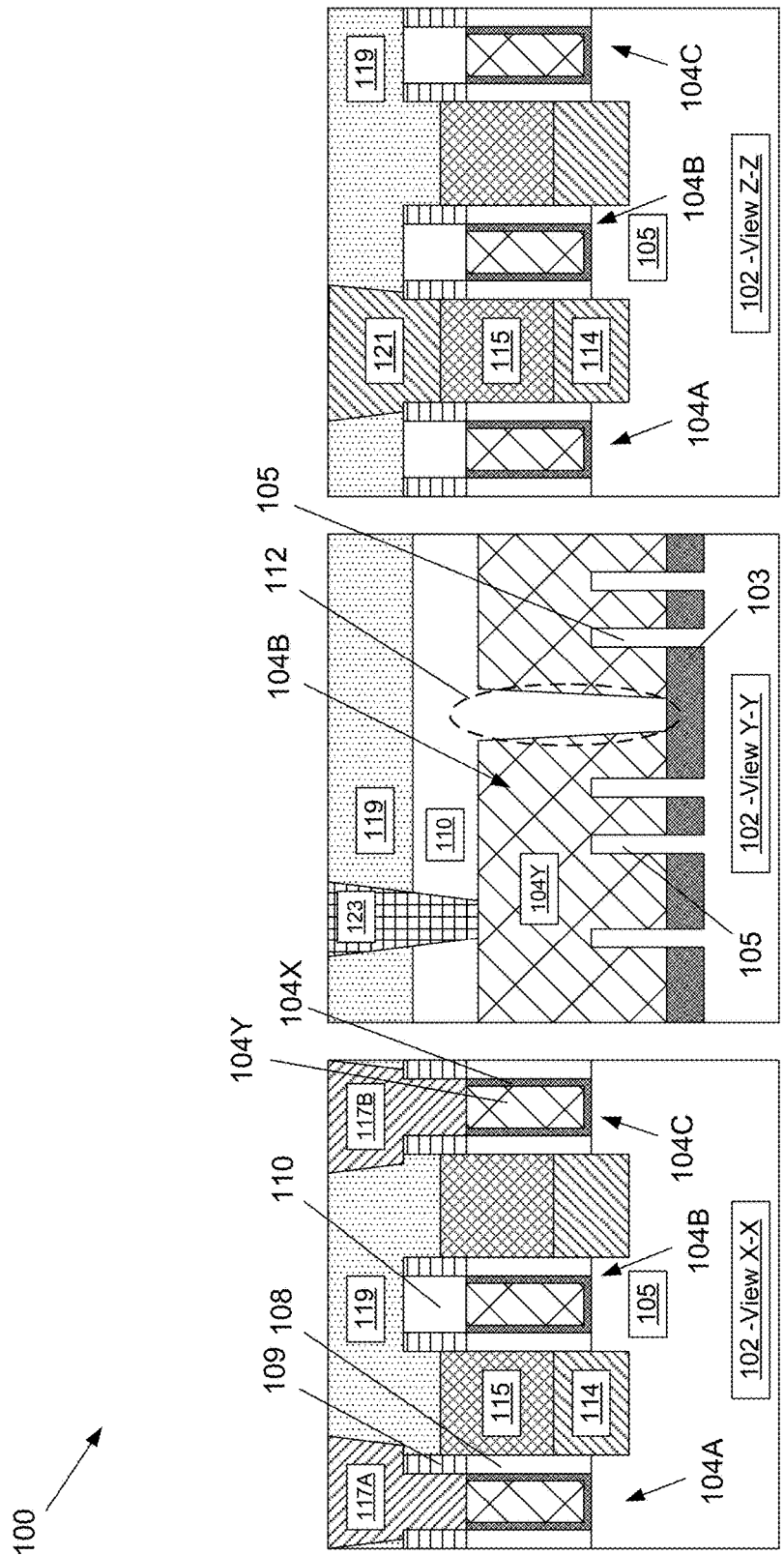
Figure 2B:
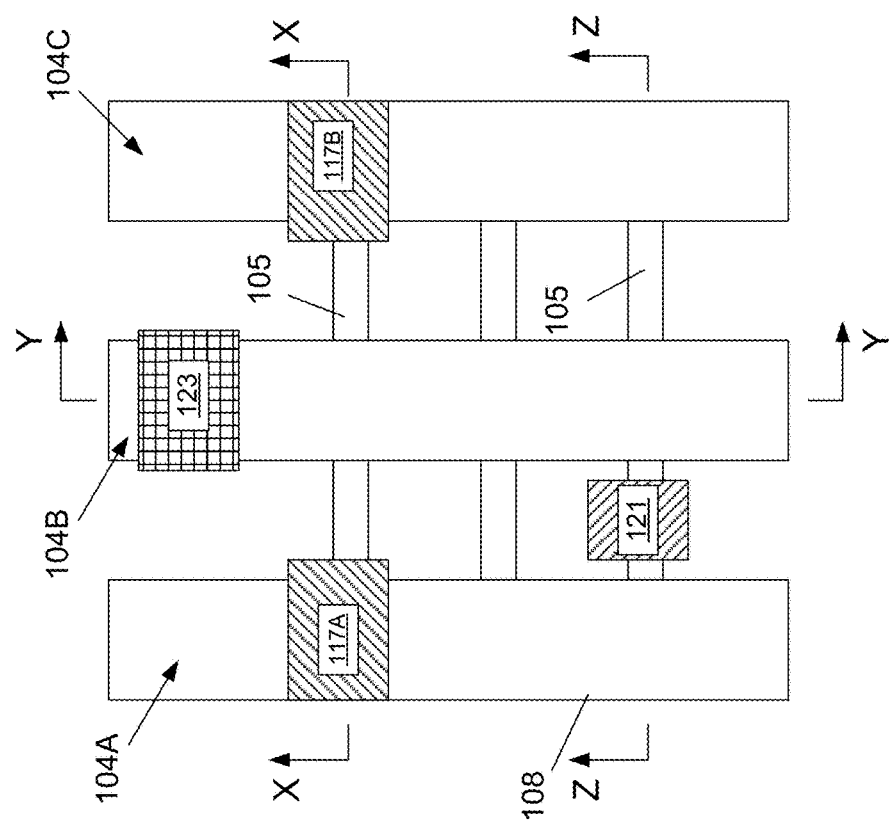

FIG. 2B contains a simplistic plan view showing where various cross-sectional views in the other drawings are taken. FIG. 2B does not contain all of the detailed structures shown in FIG. 2A, and FIG. 2B does not correspond exactly with all of the features shown in FIG. 2A, (for example, the number of fins 105 shown in FIG. 2B is not the same as the number of fins 105 shown in FIG. 2A), as FIG. 2B is only included so as to show where various cross-sectional views are taken. As indicated in FIG. 2B, the view X-X is a cross-sectional view taken through the product 100 (in a direction corresponding to the gate length direction of the illustrative FinFET transistor devices) at a location where gate contact ("CB") structures 117A, 117B are formed so as to contact the underlying gates 104A, 104C, respectively. The view Y-Y is a cross-sectional view taken through the gate 104B (in a direction corresponding to the gate width direction of the device) at a location where a gate contact structure 123 was formed so as to establish electrical contact with the gate 104B. The view Z-Z is a cross-sectional view taken through the product 100 (in a direction corresponding to the gate length direction of the transistor devices) at a location where a source/drain (S/D) contact ("CA") structure 121 was formed so as to establish electrical contact with the source/drain region. It should also be noted that not all aspects of the processing shown in the cross-sectional views will be depicted in the plan views so as to not overly complicate the drawings.

With continuing reference to FIG. 2A, the illustrative product 100 will be formed in and above a semiconductor substrate 102. The product 100 may comprise either NMOS transistors, PMOS transistors or both types of transistors. Additionally, various doped regions, e.g., S/D extension implant regions, halo implant regions, well regions and the like, are not depicted in the attached drawings. The product 100 may also be comprised of so-called passive devices such as, for example, resistors, capacitors, etc. The substrate 102 may have a variety of configurations, such as the depicted bulk semiconductor (e.g., silicon) configuration. The substrate 102 may also have a semiconductor-on-insulator (SOI) configuration that includes a bulk semiconductor layer, a buried insulation layer and an active layer, wherein semiconductor devices are formed in and above the active layer. The substrate 102 may be made of silicon or it may be made of semiconductor materials other than silicon. Thus, the terms "substrate" or "semiconductor substrate" should be understood to cover all semiconductor materials and all forms of such materials.

In the example depicted herein, the novel methods and devices will be described in the context where a replacement gate manufacturing technique was used to form the gate structure for the product 100. However, the gate structures may be formed using traditional gate-first manufacturing techniques as well. Accordingly, FIG. 2A depicts the product 100 at a point in fabrication wherein several process operations have been performed to form a plurality of illustrative gates 104A-C. The gates 104A-C each comprise an illustrative replacement gate structure (comprised of a gate insulation layer 104X and a conductive gate electrode 104Y), sidewall spacers 108 (e.g., silicon carbon boron nitride) and 109 (e.g., SiCO) and a gate cap 110 (e.g., silicon nitride). The replacement gate structures depicted herein are intended to be representative in nature of any type of gate structure that may be employed in manufacturing integrated circuit products using so-called gate-last (replacement gate) manufacturing techniques. The replacement gate structures may be comprised of a variety of different materials. In one illustrative embodiment, the replacement gate structures may comprise a high-k (k value greater than 10) gate insulation layer 104X, such as hafnium oxide (or other high-k materials), and one or more conductive metal or metal alloy layers (e.g., titanium, titanium nitride) that function as the gate electrode 104Y. As shown in view Y-Y, the gate 140B has been cut and filled with the material of the gate cap 110 as indicated in the dashed line region 112. An isolation material 103 was formed in the bottom of the fin-formation trenches that were defined in the substrate 102 so as to define the fins 105.

FIG. 2A also depicts the product 100 after several other process operations were performed as well. For example, optional regions of epi semiconductor material were formed in the S/D regions of the transistor devices so as to define illustrative raised epi source/drain regions 114. However, the raised epi source/drain regions 114 need not be formed in all applications. Also depicted are illustrative conductive source/drain contact structures 115 which may include a so-called "trench silicide" (TS) material, although the source/drain contact structures 115 need not include such trench silicide materials. The conductive source/drain contact structures 115 are formed so as to establish electrical contact to the raised epi source/drain regions 114. The conductive source/drain contact structures 115 may be "line-type" structures or "point-type" structures in terms of their overall configuration when viewed from above.

At the point of fabrication depicted in FIG. 2A, a layer of insulating material 119, e.g., an ILD comprised of, for example, silicon dioxide, was formed above the substrate 102. Other layers of material, such as contact etch stop layers, are not shown so as not to overly complicate the drawings. Thereafter, the gate contact ("CB") structures 117A, 117B and 123 were formed so as to contact the underlying gates 104A, 104C, and 104B and the illustrative source/drain (S/D) contact ("CA") structure 121 was formed so as to establish electrical contact with the source/drain region using known manufacturing techniques.

Figure 2C:
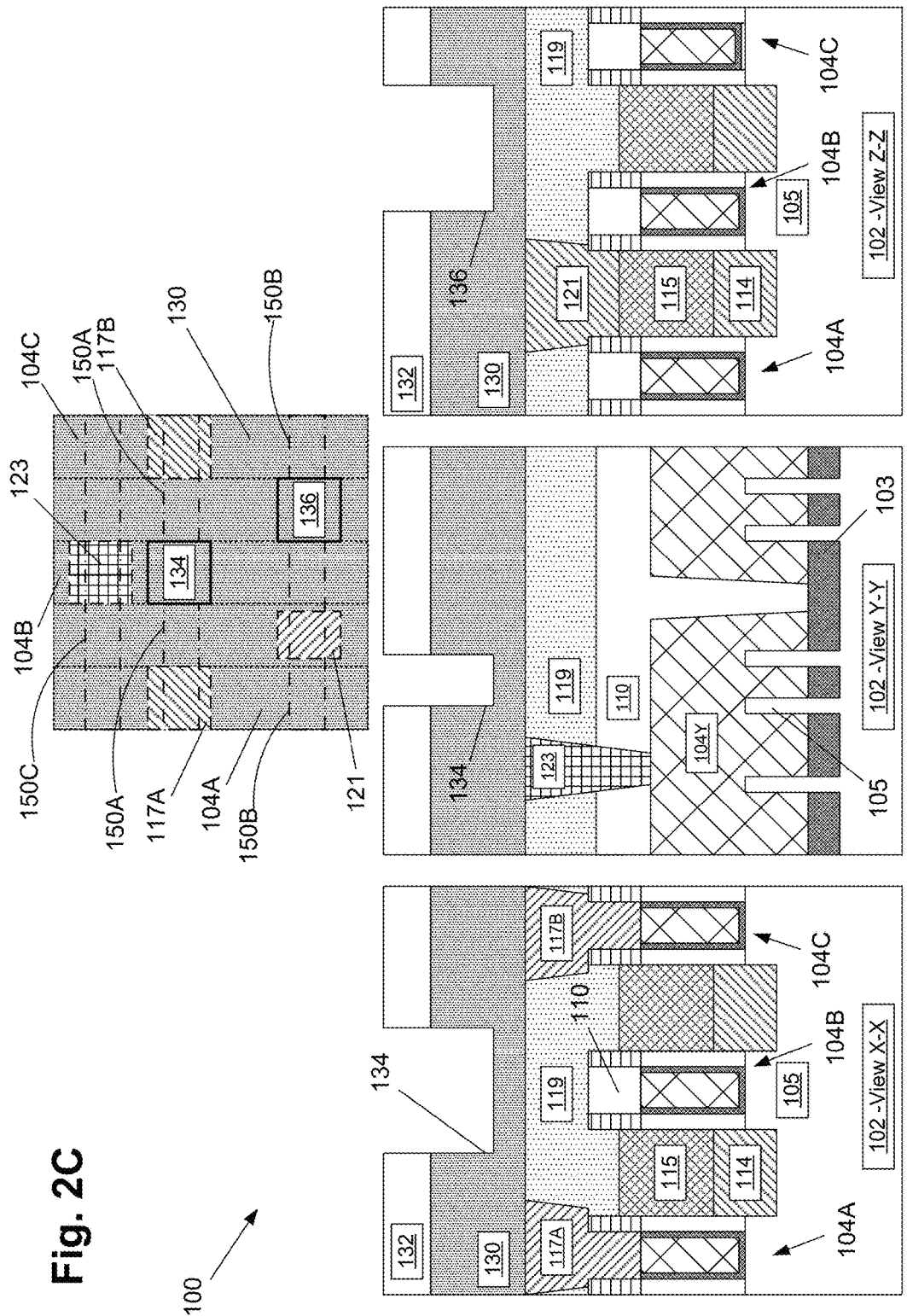

FIG. 2C depicts the product 100 after several process operations were performed. First, a layer of insulating material 130 was deposited above the product 100. Thereafter, a first patterned etch mask 132, e.g., a layer of photoresist, an anti-reflective coating layer and a planarizing layer, was formed above the layer of insulating material 130. Next, one or more etching processes, e.g., timed etching processes, were performed through the first patterned etch mask 132 to define a plurality of openings 134, 136 in the layer of insulating material 130. In some embodiments, the openings 134, 136 may not extend through the entire vertical thickness of the layer of insulating material 130, as depicted in FIG. 2C. In some applications, the etching process may be controlled such that the bottom of the openings 134, 136 is located at a level that is above a level of the upper surface of the structures 117A, 117B, 121 and 123. In other applications, the openings 134, 136 may be formed so as to extend completely through the layer of insulating material 130 and at least partially into the layer of insulating material 119 (a situation not depicted in the drawings). The layer of insulating material 130 may be formed of any desired material, e.g., silicon dioxide, a low-k material (k value of less than 3.5), etc., and it may be formed to any desired thickness. In some applications, the layer of insulating material 130 may be made of the same material as that of the layer of insulating material 119, but that need not be the case in all applications.

FIG. 2C also contains a simplistic plan view of the product 100 with the first patterned masking layer 132 removed. In general, as discussed more fully below, eventually a plurality of conductive metallization lines 150A-C (indicated in dashed lines in the plan view) will be formed on the product 100 in trenches that will be defined in the layer of insulating material 130 so as to establish electrical contact to one or more underlying contact structures. The underlying contact structures may have any configuration or structure and they may be used for any function or purpose, e.g., a gate contact structure, a source/drain contact structure, a contact structure to a resistor, a conductive via positioned in an underlying layer of insulating material (not shown), etc. As depicted, the trenches and the conductive metallization lines 150A-C will be run in a direction that is transverse to the long axis of the gates 104A-C. In the example shown herein, the conductive metallization line 150A will be used to establish electrical contact to the conductive gate contact structures 117A, 117B on the gates 104A, 104C; the conductive metallization line 150B will be used to establish electrical contact to the conductive source/drain contact structure 121; and the conductive metallization line 150C will be used to establish electrical contact to the conductive gate contact structure 123 on the gate 104B. The openings 134, 136 may have any desired configuration or shape when viewed from above. In the depicted example, the openings 134, 136 have a generally rectangular configuration. In general, as shown in the plan view, the opening 134 is located in the layer of insulating material 130 at a location that is in the path of a metallization trench to be formed in the layer of insulating material 130 for the metallization line 150A. Similarly, the opening 136 is located in the layer of insulating material 130 at a location that is in the path of a metallization trench to be formed in the layer of insulating material 130 for the metallization line 150B. As described more fully below, a metallization blocking structure will be formed in each of the openings 134, 136 so as to prevent formation of a continuous metallization line, i.e., to effectively "cut" the metallization lines prior to the actual formation of the metallization lines by preventing formation of a portion of what would otherwise be a continuous metallization line.

Figure 2D:
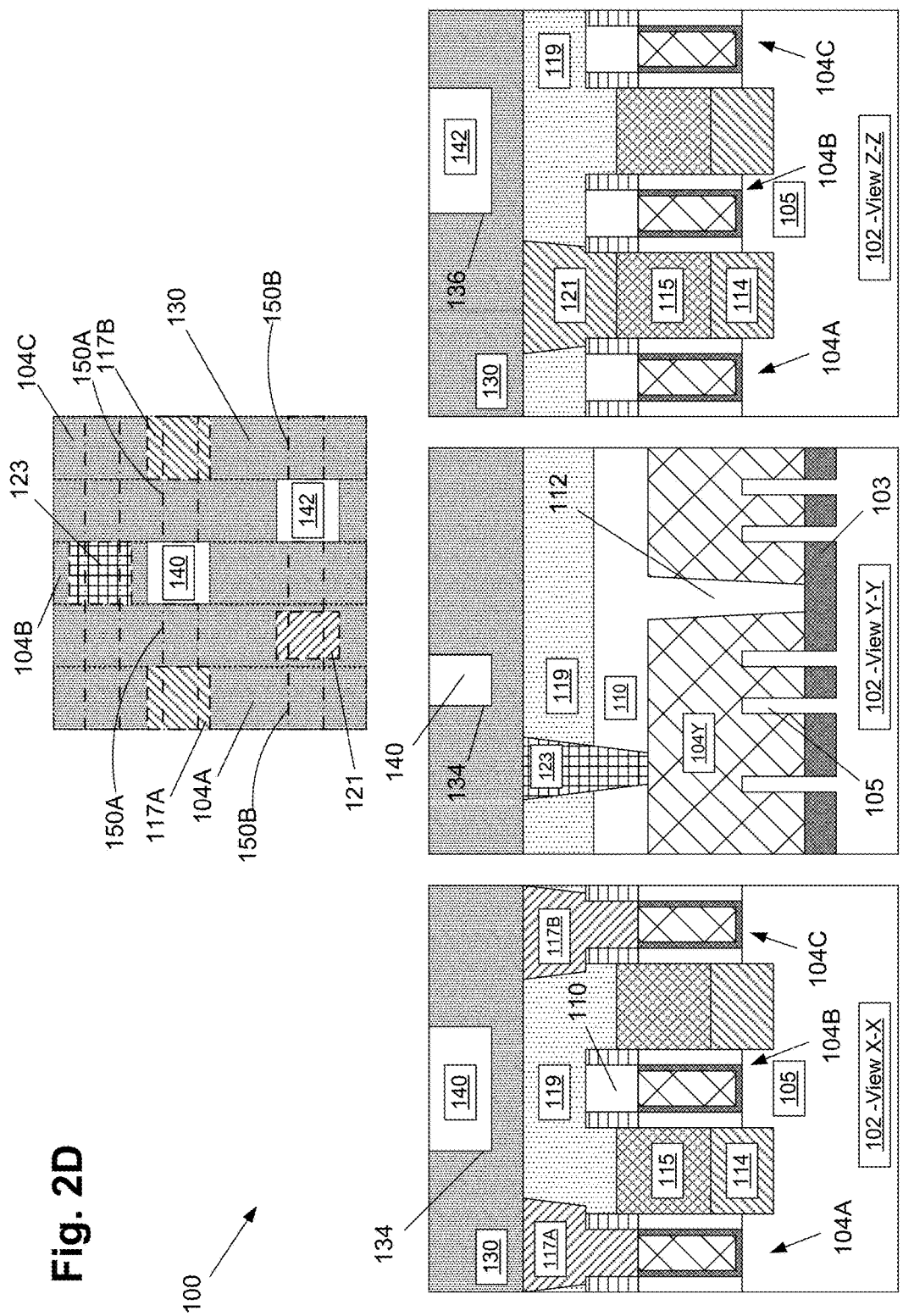

FIG. 2D depicts the product 100 after several process operations were performed. First, the first patterned etch mask 132 was removed. Thereafter a first metallization blocking structure 140 was formed in the opening 134 and a second metallization blocking structure 142 was formed in the opening 136. The first and second metallization blocking structures 140, 142 are formed of an insulting material (k value of 7 or less) that is different than the insulating material of the layer of insulating material 130. In one particular embodiment, the materials of the first and second metallization blocking structures 140, 142 and layer of insulating material 130 are selectively etchable relative to one another. For example, the first and second metallization blocking structures 140, 142 may be comprised of silicon nitride, while the layer of insulating material 130 is comprised of silicon dioxide. The first and second metallization blocking structures 140, 142 may be formed by depositing the material for the first and second metallization blocking structures 140, 142 so as to over-fill the openings 134, 136 and thereafter performing a CMP process on the deposited material using the layer of insulating material 130 as a polish-stop layer so as to remove portions of the material for the first and second metallization blocking structures 140, 142 positioned outside of the openings 134, 136 and above the upper surface of the layer of insulating material 130. As shown in the plan view, the first metallization blocking structure 140 is located in the layer of insulating material 130 at a location that is in the path of a metallization trench to be formed in the layer of insulating material 130 for the metallization line 150A. Similarly, the second metallization blocking structure 142 is located in the layer of insulating material 130 at a location that is in the path of a metallization trench to be formed in the layer of insulating material 130 for the metallization line 150B. As noted above, the first metallization blocking structure 140 will prevent the formation of a continuous metallization line 150A, while the second metallization blocking structure 142 will prevent the formation of a continuous metallization line 150B.

FIG. 2E depicts the product 100 after a second patterned etch mask 144, e.g., a layer of photoresist, an anti-reflective coating layer and a planarizing layer, was formed above the layer of insulating material 130. The patterned etch mask comprises a plurality of line-type openings 144A, 144B and 144C that correspond to locations where individual metallization trenches will be formed in the layer of insulating material 130 for conductive metallization lines 150A, 150B and 150C, respectively. Note that portions of the first and second metallization blocking structures 140, 142 are exposed in the openings 144A, 144B in the second patterned etch mask 144.

Figure 2F:
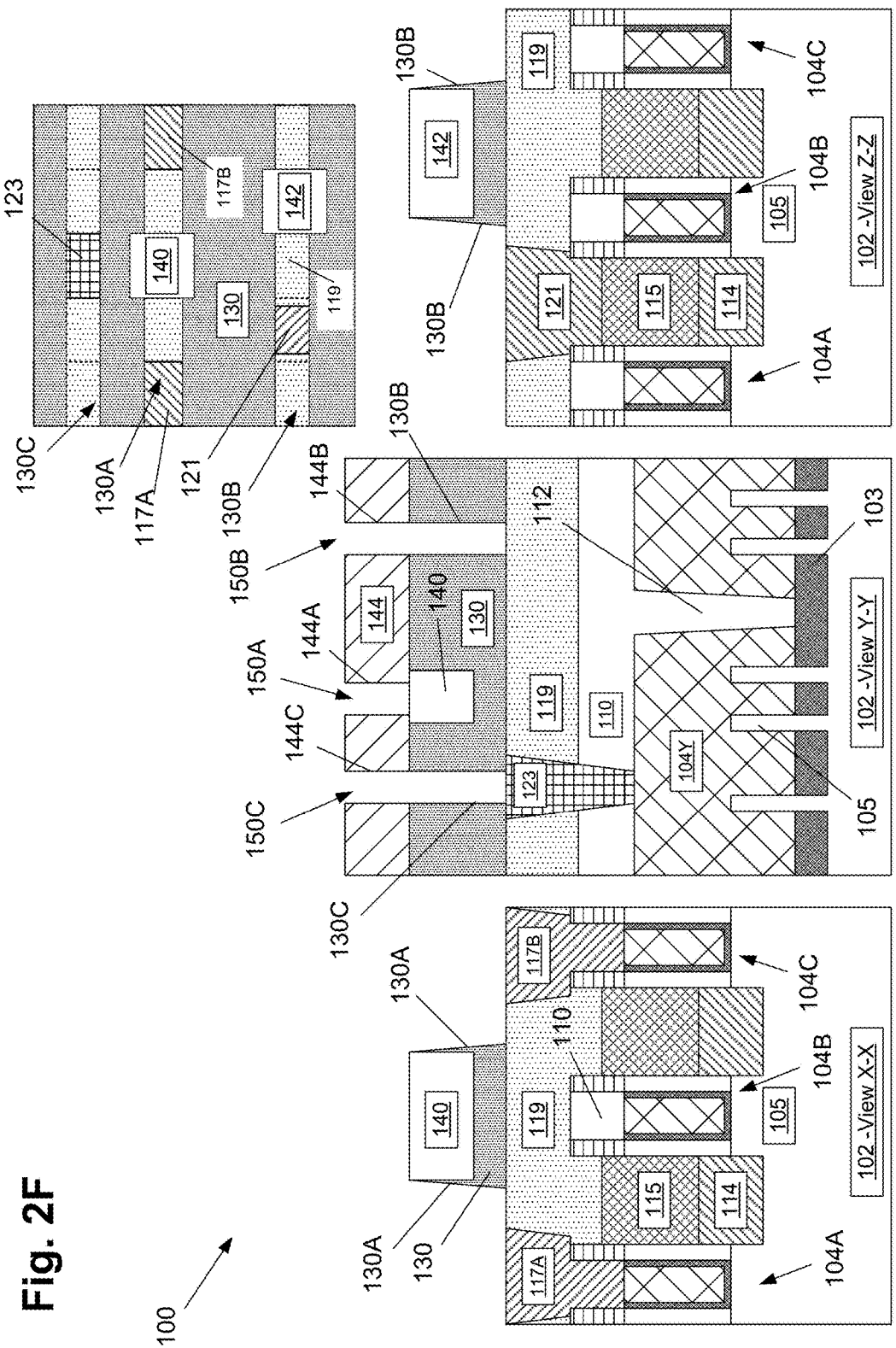

FIG. 2F depicts the product after one or more etching processes, e.g., timed etching processes, were performed through the second patterned etch mask 144 to define a plurality of metallization trenches 130A, 130B and 130C in the layer or insulating material 130. Formation of the metallization trench 130A on opposite sides of the metallization blocking structure 140 exposes the gate contact structures 117A and 117B, while formation of the metallization trench 130B on opposite sides of the metallization blocking structure 142 exposes the source/drain contact structure 121. Formation of the metallization trench 130C exposes the gate contact structure 123 for the gate 104B. Note that the metallization trenches 130A and 130B are substantially self-aligned with respect to their adjacent first and second metallization blocking structures 140, 142, respectively. In the plan view, the second patterned etch mask 144 has been removed so as to show the formation of the metallization trenches 130A, 130B and 130C in the layer of insulating material 130 and the location of the metallization blocking structures 140, 142.

Figure 2G:
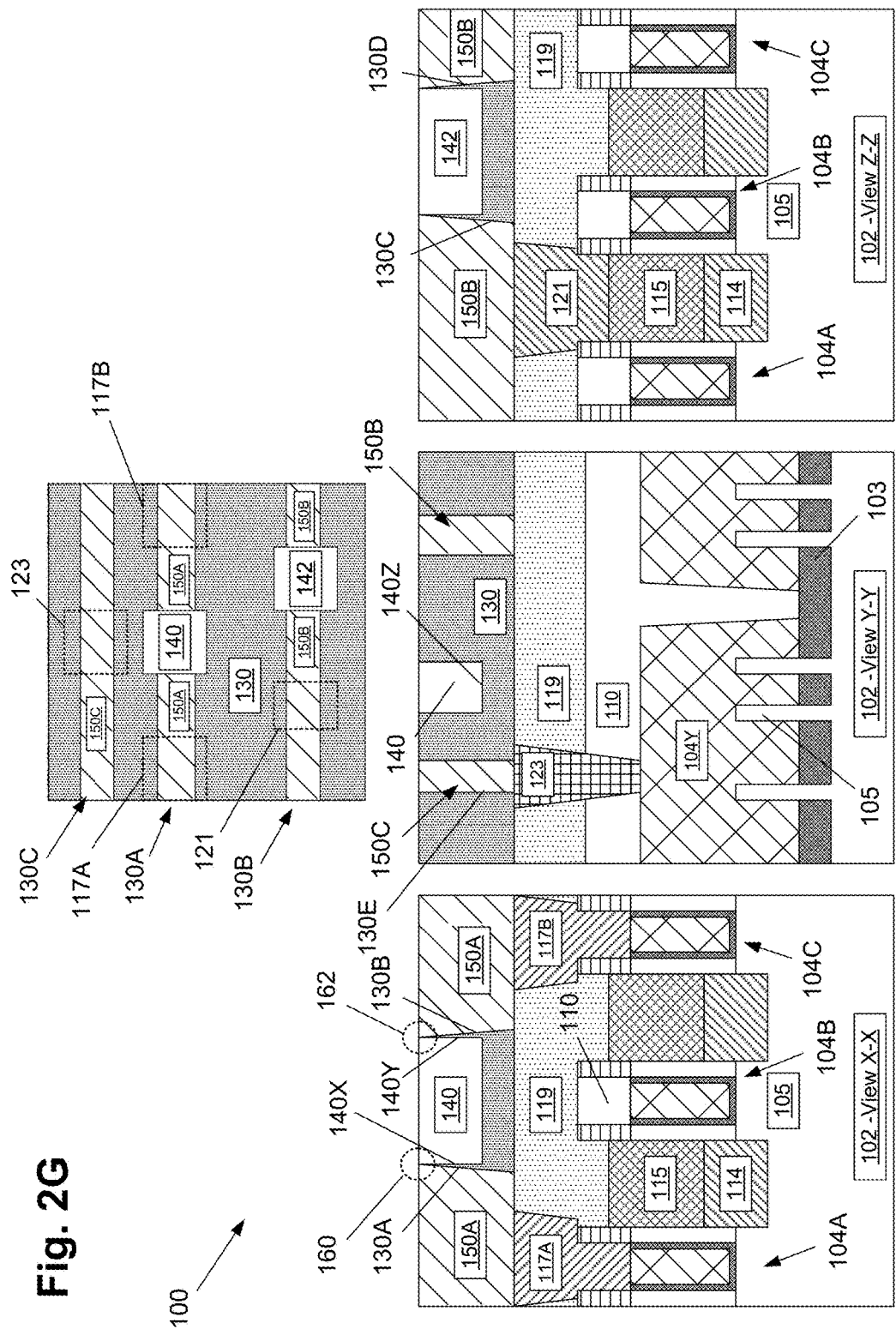

FIG. 2G depicts the product after one or more common deposition processes were performed to the conductive metallization lines 150A, 150B and 150C in the metallization trenches 130A, 130B and 130C defined in the layer of insulating material 130. The conductive metallization lines 150A-C may be formed of any conductive material, e.g., a metal, a metal alloy, copper, aluminum, etc. Moreover, the conductive metallization lines 150A-C may be formed using a variety of known techniques and they may be comprised of more than one material, such as a barrier layer (not separately shown) and a bulk conductive fill material. In one illustrative embodiment, the conductive metallization lines 150A-C may be formed by depositing material(s) for the conductive metallization lines 150A-C so as to over-fill the metallization trenches 130A-C and thereafter performing one or more planarization processes, such as CMP processes, to remove excess portions of the conductive materials positioned outside of the metallization trenches 130A-C above the upper surface of the layer of insulating material 130 and the first and second metallization blocking structures 140, 142. As depicted, due to the formation of the first metallization blocking structure 140 prior to the formation of the conductive metallization line 150A, the conductive metallization line 150A is not formed as a continuous line, i.e., the metallization line 150A comprises separate first and second portions that are positioned on opposite sides of the first metallization blocking structure 140 and electrically isolated from one another by the insulating first metallization blocking structure 140. The first portion of the line 150A provides electrical contact to the gate contact 117A, while the second portion of the line 150A positioned on the opposite side of the first metallization blocking structure 140 provides electrical contact to the gate contact structure 117B. Similarly, due to the formation of the second metallization blocking structure 142 prior to the formation of the conductive metallization line 150B, the conductive metallization line 150B is not formed as a continuous line, i.e., the metallization line 150B comprises separate first and second portions that are positioned on opposite sides of the second metallization blocking structure 142 and electrically isolated from one another by the insulating second metallization blocking structure 142. The first portion of the line 150B provides electrical contact to the source/drain contact structure 121, while the second portion of the line 150B can be routed across the substrate to provide electrical contact to other devices or structures. Since there was no metallization blocking structure formed in the path of the metallization trench 130C, the conductive metallization line 150C is formed as a continuous line that is conductively contacted to the gate contact 123. At this point, additional metallization layers (not shown) comprised of additional metallization lines may be formed above the product depicted in FIG. 2G.

With reference to FIG. 2G, it should be noted that, due to the fact that the trenches 130A and 130B are substantially self-aligned with respect to their adjacent first and second metallization blocking structures 140, 142, respectively, portions of the associated conductive metallization lines 150A, 150B may contact portions of their respective metallization blocking structures 140, 142. For example, as shown in the dashed line region 160, a first portion of the conductive metallization line 150A may physically contact a portion of a first side 140X of the metallization blocking structure 140. Similarly, as shown in the dashed line region 162, a second portion of the conductive metallization line 150A may physically contact a second side 140Y of the metallization blocking structure 140, wherein the second side 140Y is opposite to the first side 140X of the metallization blocking structure 140. Also note that, in some cases, the metallization blocking structures 140, 142 may have a vertical thickness that is less than a vertical thickness of the layer of insulating material 130, i.e., the metallization blocking structures 140, 142 may be positioned entirely within the vertical thickness of the insulating material 130. In that situation, a bottom surface 140Z of, for example, the metallization blocking structure 140 is positioned on and in contact with a portion of the layer of insulating material 130.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method, comprising:
   forming a layer of insulating material comprising a first insulating material above a semiconductor substrate;
   removing a first portion of said layer of insulating material to define a recess;
   forming a metallization blocking structure in said recess at a location that is in a path of a metallization trench to be formed in said layer of insulating material, said metallization blocking structure comprising a second insulating material that is different from said first insulating material;
   after forming said metallization blocking structure, forming a first patterned etch mask having a trench opening defined therein above said layer of insulating material and removing a second portion of said layer of insulating material through said trench opening to define said metallization trench in said layer of insulating material on opposite sides of said metallization blocking structure; and forming a conductive metallization line in said metallization trench on opposite sides of said metallization blocking structure.

2. The method of claim 1, wherein said first insulating material and said second insulating material are selectively etchable relative to one another.

3. The method of claim 1, wherein said first insulating material comprises silicon dioxide, said second insulating material comprises silicon nitride, said conductive metallization line comprises one of a metal or a metal alloy and said conductive metallization line is formed in an M0 level of a metallization system formed above said substrate.

4. The method of claim 1, wherein forming said metallization trench exposes a contact structure comprising one of a gate contact, a source/drain contact or a conductive via and wherein said conductive metallization line is formed on and in contact with said contact structure.

5. The method of claim 1, wherein forming said metallization blocking structure in said layer of insulating material comprises:
   forming a second patterned etch mask above said layer of insulating material;
   performing an etching process through said second patterned etch mask to form an opening in said layer of insulating material;
   depositing said second insulating material so as to overfill said opening; and
   performing a chemical mechanical polishing process on said second insulating material using said layer of insulating material as a polish-stop layer so as to remove portions of said second insulating material positioned outside of said opening and above an upper surface of said layer of insulating material.

6. The method of claim 5, wherein said opening is formed such that it extends through an entire vertical thickness of said layer of insulating material.

7. The method of claim 1, wherein forming said conductive metallization line comprises forming said conductive metallization line in said metallization trench such that a first portion of said conductive metallization line physically contacts a portion of a first side of said metallization blocking structure and a second portion of said conductive metallization line physically contacts a second side of said metallization blocking structure that is opposite to said first side of said metallization blocking structure.

8. The method of claim 1, wherein said second insulating material comprises a material having a k value of less than 7.

9. A method, comprising:
   forming a layer of insulating material comprising a first insulating material above a semiconductor substrate;
   removing a first portion of said layer of insulating material to define a recess;
   forming a metallization blocking structure in said recess at a location that is in a path of a metallization trench to be formed in said layer of insulating material, said metallization blocking structure comprising a second insulating material having a k value less than 7 and wherein said second insulating material is different from said first insulating material and said first insulating material and said second insulating material are selectively etchable relative to one another;
   after forming said metallization blocking structure, forming a first patterned etch mask having a trench opening defined therein above said layer of insulating material and removing a second portion of said layer of insulating material through said trench opening to define said metallization trench in said layer of insulating material on opposite sides of said metallization blocking structure; and
   forming a conductive metallization line in said metallization trench on opposite sides of said metallization blocking structure, wherein said conductive metallization line comprises one of a metal or a metal alloy.

10. The method of claim 9, wherein said first insulating material comprises silicon dioxide, said second insulating material comprises silicon nitride, and said conductive metallization line is formed in an M0 level of a metallization system formed above said substrate.

11. The method of claim 9, wherein forming said metallization trench exposes a contact structure comprising one of a gate contact, a source/drain contact or a conductive via and wherein said conductive metallization line is formed on and in contact with said contact structure.

12. The method of claim 9, wherein forming said metallization blocking structure in said layer of insulating material comprises:
   forming a second patterned etch mask above said layer of insulating material;
   performing an etching process through said second patterned etch mask to form an opening in said layer of insulating material;
   depositing said second insulating material so as to overfill said opening; and
   performing a chemical mechanical polishing process on said second insulating material using said layer of insulating material as a polish-stop layer so as to remove portions of said second insulating material positioned outside of said opening and above an upper surface of said layer of insulating material.

13. The method of claim 12, wherein said opening is formed such that it extends through an entire vertical thickness of said layer of insulating material.

14. The method of claim 9, wherein forming said conductive metallization line comprises forming said conductive metallization line in said metallization trench such that a first portion of said conductive metallization line physically contacts a portion of a first side of said metallization blocking structure and a second portion of said conductive metallization line physically contacts a second side of said metallization blocking structure that is opposite to said first side of said metallization blocking structure.

15. A method, comprising:
   forming a conductive structure;
   forming a layer of insulating material comprising a first insulating material above said conductive structure;
   removing a first portion of said layer of insulating material to define a recess;
   forming a metallization blocking structure in said recess at a location that is in a path of a metallization trench to be formed in said layer of insulating material, said metallization blocking structure comprising a second insulating material that is different from said first insulating material;
   after forming said metallization blocking structure, removing a second portion of said layer of insulating material to define said metallization trench in said layer of insulating material on opposite sides of said metallization blocking structure, said metallization trench exposing at least a portion of said conductive structure; and
   forming a conductive metallization line in said metallization trench on opposite sides of said metallization blocking structure, wherein a portion of said conductive metallization line contacts said at least a portion of said conductive structure.

16. The method of claim 15, wherein said first insulating material and said second insulating material are selectively etchable relative to one another.

17. The method of claim 15, wherein said first insulating material comprises silicon dioxide, said second insulating material comprises silicon nitride, said conductive metallization line comprises one of a metal or a metal alloy and said conductive metallization line is formed in an M0 level of a metallization system formed above a substrate.

18. The method of claim 15, wherein said conductive structure comprises one of a gate contact, a source/drain contact, or a conductive via.

19. The method of claim 15, wherein forming said metallization blocking structure in said layer of insulating material comprises:
forming a patterned etch mask above said layer of insulating material;
performing an etching process through said patterned etch mask to form an opening in said layer of insulating material;
depositing said second insulating material so as to overfill said opening; and
performing a chemical mechanical polishing process on said second insulating material using said layer of insulating material as a polish-stop layer so as to remove portions of said second insulating material positioned outside of said opening and above an upper surface of said layer of insulating material.

20. The method of claim 19, wherein said opening is formed such that it extends through an entire vertical thickness of said layer of insulating material.

21. The method of claim 16, wherein forming said conductive metallization line comprises forming said conductive metallization line in said metallization trench such that a first portion of said conductive metallization line physically contacts a portion of a first side of said metallization blocking structure and a second portion of said conductive metallization line physically contacts a second side of said metallization blocking structure that is opposite to said first side of said metallization blocking structure.

22. The method of claim 15, wherein said second insulating material comprises a material having a k value of less than 7.

* * * * *